(12) United States Patent
Kung

(10) Patent No.: US 7,876,555 B2
(45) Date of Patent: Jan. 25, 2011

(54) PORTABLE STORAGE DEVICE

(75) Inventor: Cheng-Chung Kung, Taipei (TW)

(73) Assignee: A-Data Technology Co., Ltd., Taipei (TW)

( * ) Notice: Subject to any disclaimer, the term of this patent is extended or adjusted under 35 U.S.C. 154(b) by 267 days.

(21) Appl. No.: 12/289,718

(22) Filed: Nov. 3, 2008

(65) Prior Publication Data

US 2009/0147460 A1 Jun. 11, 2009

Related U.S. Application Data

(60) Provisional application No. 60/996,898, filed on Dec. 10, 2007.

(51) Int. Cl.
*G06F 1/16* (2006.01)
(52) U.S. Cl. .................................. 361/679.31
(58) Field of Classification Search ............ 361/679.31; 720/600
See application file for complete search history.

(56) References Cited

U.S. PATENT DOCUMENTS

| | | | |
|---|---|---|---|
| 5,648,760 A * | 7/1997 | Kumar | 340/825.25 |
| 7,088,575 B2 * | 8/2006 | Chiu et al. | 361/679.31 |
| 2004/0212966 A1 * | 10/2004 | Fisher et al. | 361/726 |
| 2005/0152104 A1 * | 7/2005 | Kaply et al. | 361/683 |
| 2008/0218957 A1 * | 9/2008 | Kim | 361/684 |
| 2009/0021904 A1 * | 1/2009 | Yang | 361/684 |
| 2010/0008035 A1 * | 1/2010 | Okumura | 361/679.31 |

* cited by examiner

*Primary Examiner*—Lisa Lea-Edmonds
(74) *Attorney, Agent, or Firm*—Rosenberg, Klein & Lee

(57) ABSTRACT

A portable storage device comprises a protecting housing, a casing, a keystroke, a circuit board, and an electrical plug. There is an orientating hole which comprises the first fixing portion formed on the protecting housing. The casing slides in the interior of the protecting housing, and comprises a flexible arm which corresponds in position to the orientating hole. The keystroke is positioned between the flexible arm and the orientating hole, and fixed with the orientating hole when the second fixing portion formed on the keystroke is latched with the first fixing portion. Such that the electrical plug connected with the circuit board mounted in the casing can be moved selectively in or out of the protecting housing through the keystroke. Thereby, it is convenient for a user to protect the electrical plug of the portable storage device, and the reliability of the device can be improved automatically.

7 Claims, 5 Drawing Sheets

PORTABLE STORAGE DEVICE

REFERENCE TO RELATED APPLICATION

This Application is based on Provisional Patent Application Ser. No. 60/996,898, filed 10 Dec. 2007, currently pending.

BACKGROUND OF THE INVENTION

1. Field of the Invention

The present invention is related to a portable storage device, and more particular to a portable storage device that can be connected with a computer to transmit or receive data from computer.

2. Description of Related Art

FIGS. 1-3 show a conventional portable storage device, which includes a casing 1a, a circuit board 2a, a protective cover 3a and an electrical plug 4a (i.e. USB male connector). The casing 1a has an upper cover 11a and a lower cover 12a, and the upper cover 11a and the lower cover 12 can be combined to the casing 1a via ultrasonic welding technology. The circuit board 2a is mounted between the upper cover 11a and the lower cover 12a. The interior of the protective cover 3a forms an accommodating space which can accommodate the plug 4a (not show). The electrical plug 4a is electrically connected with the circuit board 2a and one part of the electrical plug 4a extends outside the upper cover 11a and lower cover 12a of the main body 1a.

When the electrical plug 4a is connected with a computer by a user, information or data can be transmitted between the portable storage device and a computer. And when the plug 4a is removed from the computer, the user can uses protective cover 3a to cover the electrical plug 4a for protecting the plug 4a from colliding with rigid objects or other dangers to extend life of the portable storage device.

However, it is inconvenient for the user to remove the protective cover 3a every time before using the portable storage device. It is also inconvenient for the user to keep the protective cover 3a when the storage device is in use, and cover it back after using.

Moreover, when the circuit board 2a in the portable storage device could not function well, it is required to disassemble the casing 1a to test or repair the circuit board 2a. Such that it will be very easy to damage the casing and increasing the cost of production.

SUMMARY OF THE INVENTION

The object of the present invention is to provide a portable storage device, which can be connected with a computer to transmit and receive data between the portable storage device and the computer. The further object of the present invention is to provide a portable storage device which can be disassembled conveniently, the cost of the assembly can be reduced, and the electrical plug can be protected more efficiency.

For achieving the object described above, one of the embodiments of the present invention provides a portable storage device comprises a protecting housing, a casing, a keystroke, a circuit board and an electrical plug. The protecting housing comprises an opening aperture which is formed on one end of the housing, and an orientating hole which has the first fixing portion formed on it. The casing slides in the interior of the protecting housing and comprises a flexible arm which is positioned corresponding to the orientating hole. The keystroke which comprises the second fixing portion is coupled with and positioned between the flexible arm and the orientating hole. The casing can be moved selectively through the keystroke, and fixed with the protecting housing when the second fixing portion is coupled with the first fixing portion of the orientating hole. The electrical plug is connected with the circuit board which is mounted in the casing, and at least one part of the electrical plug is exposed outside the casing. Such that the electrical plug can be driven by the keystroke through the casing, and extend outside the opening aperture of the protecting housing.

It is to be understood that both the foregoing general description and the following detailed description are exemplary, and are intended to provide further explanation of the present invention as claimed. Other advantages and features of the invention will be apparent from the following description, drawings and claims, but these are illustrative only and are not meant to limit the present invention.

BRIEF DESCRIPTION OF THE DRAWINGS

The above and further advantages of the present invention may be better understood by referring in the following description, taken in conjunction with the accompanying drawings, in which.

The drawings will be described further in connection with the following detailed description of the present invention.

DETAILED DESCRIPTION OF THE PREFERRED EMBODIMENTS

Figure 1:
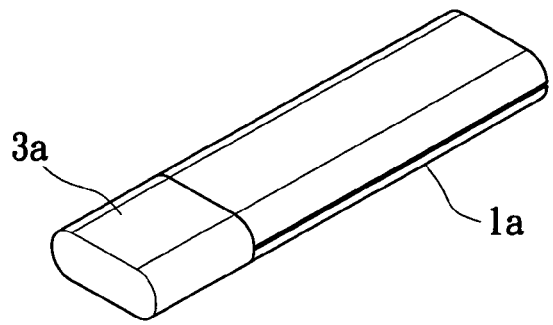
FIG. 1 is an assembled perspective view of the conventional portable storage device of the prior art.
Figure 2:
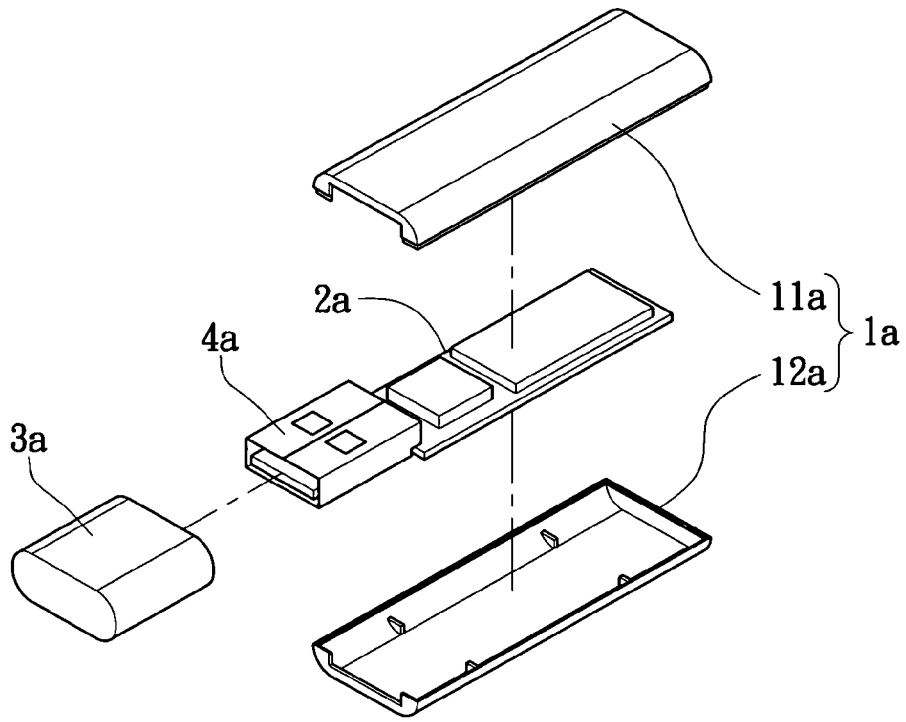
FIG. 2 is an exploded perspective view of the conventional portable storage device of the prior art.
Figure 3:
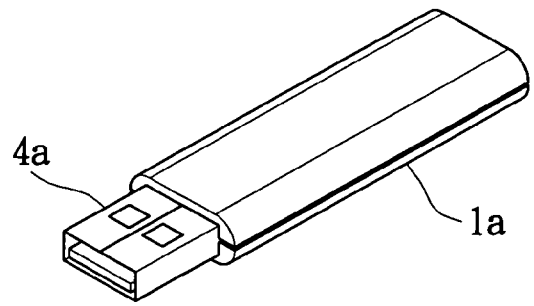
FIG. 3 is a schematic view of the used state of the conventional portable storage device of the prior art.
Figure 4:
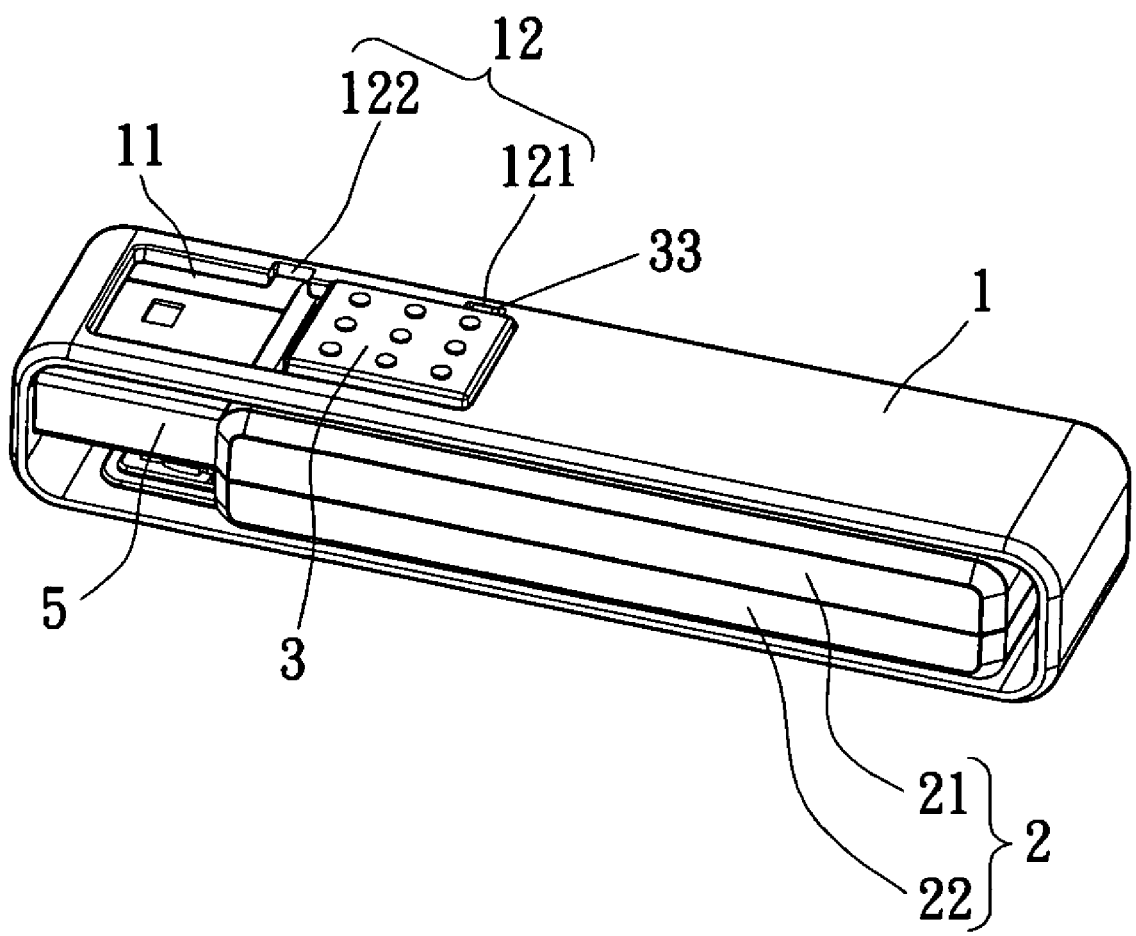
FIG. 4 is an assembled perspective view of the portable storage device according to the present invention.
Figure 5:
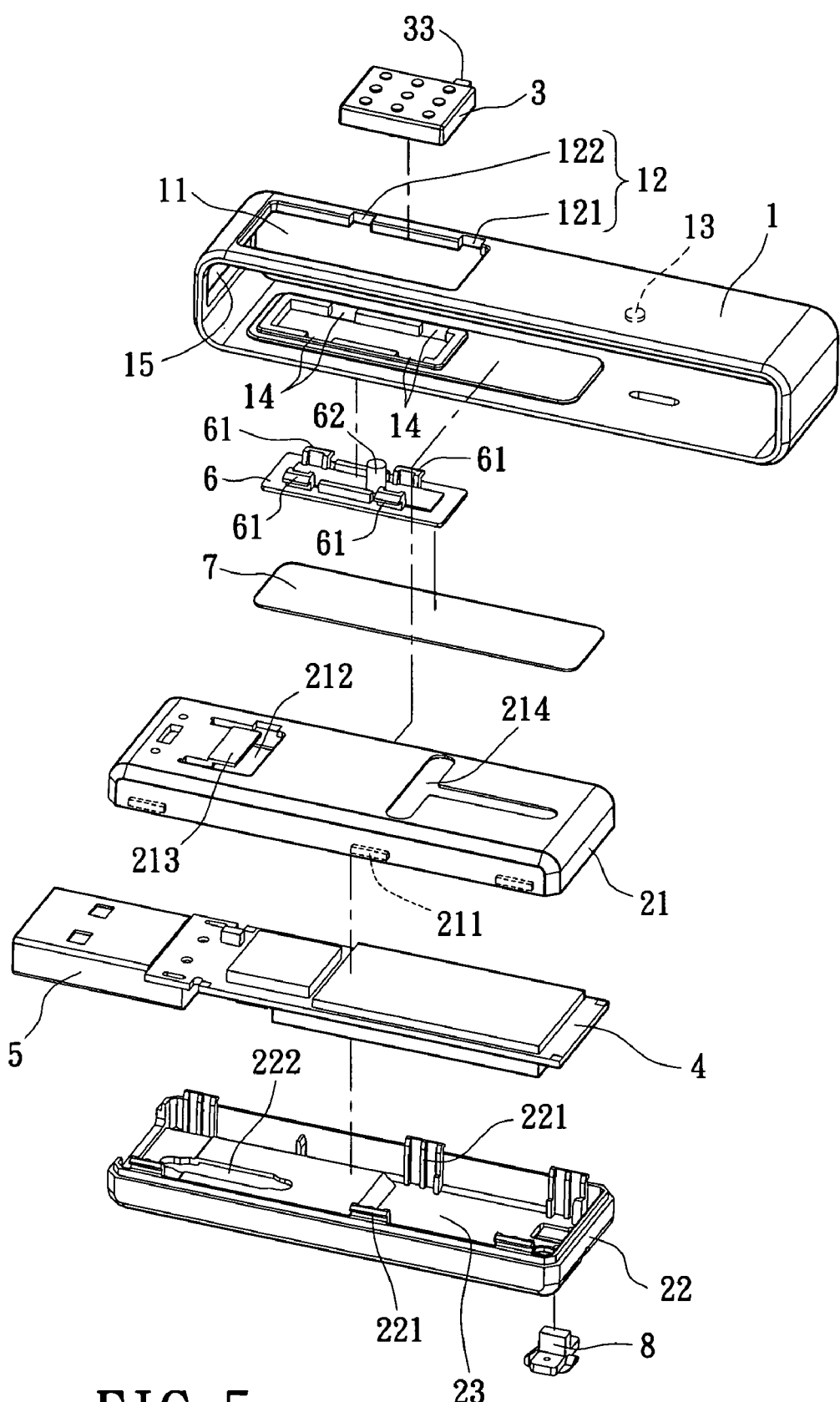
FIG. 5 is an exploded perspective view of the portable storage device according to the present invention.

Please refer to FIGS. 4-5, the embodiment of the present invention provides a portable storage device like USB Flash Drive (UFD), MP3 Player, Media Recorder, etc., which comprises a protecting housing 1, a casing 2, a keystroke 3, a circuit board 4, an electrical plug 5, a guiding unit 6, a decorating board 7 and a light-guiding unit 8.

The protecting housing 1 has an orientating hole 11, the first fixing portion 12, a first guiding pillar 13 and the third sticking gap 14. The orientating hole 11 is formed on the protecting housing 1 and comprises the first fixing portion 12 which includes the first sticking gap 121 and the second sticking gap 122. The first sticking gap 121 and the second sticking gap 122 are formed concavely and separately at least on one side of the orientating hole 11. The first guiding pillar 13 is arranged protruding from an inner wall of the protecting housing 1.

The casing 2 includes a cover 21 and a base 22, wherein the base 22 is combined with the cover 21 to form the casing 2. The cover 21 has the first buckle portion 211, a through hole 212, a flexible arm 213 and the first guiding groove 214. The base 22 has the second buckle portion 221 and the second guiding groove 222. The casing can be assembled by connecting the first buckle portion 211 with the second buckle portion 221. At least one opening portion forms on one side of the protecting housing 1, such that the casing 2 can be moved into and assembled with the protecting housing 1. The through hole 212 is arranged corresponding to the location of the orientating hole 11. The flexible arm 213 is located on the through hole 212. The first guiding groove 214 is arranged on the cover 21 and forms a T-shaped wherein the first guiding pillar 13 of the protecting housing 1 can be coupled with the groove 214 easily when the casing 2 is assembled with the housing 1.

The circuit board 4 is located in a space 23 of the casing 2, and the electrical plug 5 electrically connects with the circuit board 4 wherein at least one part of the plug 5 is exposed outside the casing 2. An opening aperture 15 is arranged on one end of the protecting housing 1 for the plug 5 going through. Because the keystroke 3 is positioned between the casing 2 and the housing 1, and comprises the second fixing portion 33 which is coupled selectively with the first sticking gap 121 or the second sticking gap 122, the casing 2 which is driven by the keystroke 3 can be assembled with and sliding in the protecting housing 1 smoothly and selectively, and the plug 5 can alternatively extend outside or retract inside the protecting housing 1 via the opening aperture 15.

The guiding unit 6 has the fourth buckle portion 61 and the second guiding pillar 62. The third sticking gap 14 and the third buckle portion 61 couples with each other, and the second guiding pillar 62 slides in the second guiding groove 222 of the base 22 when the casing 2 is assembled with the housing 1. Then the decorating board 7 covers the guiding unit 6 to protect the portable storage device after assembling. The interior of the base 22 further has a light-guiding unit 8 used for guiding light. When the electrical plug 5 electrically connects to the connector port (i.e. USB port) of the computer, the LED which is mounted on the circuit board 4 is activated, and the light-guiding unit 8 guides light come out from the LED to show that the computer detects the portable storage device.

Figure 6:
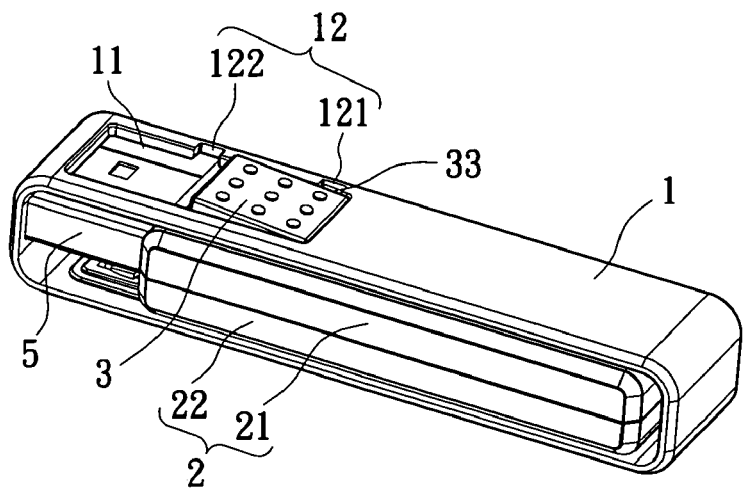
FIG. 6 is a schematic view of one used state of the portable storage device according to the present invention.
Figure 7:
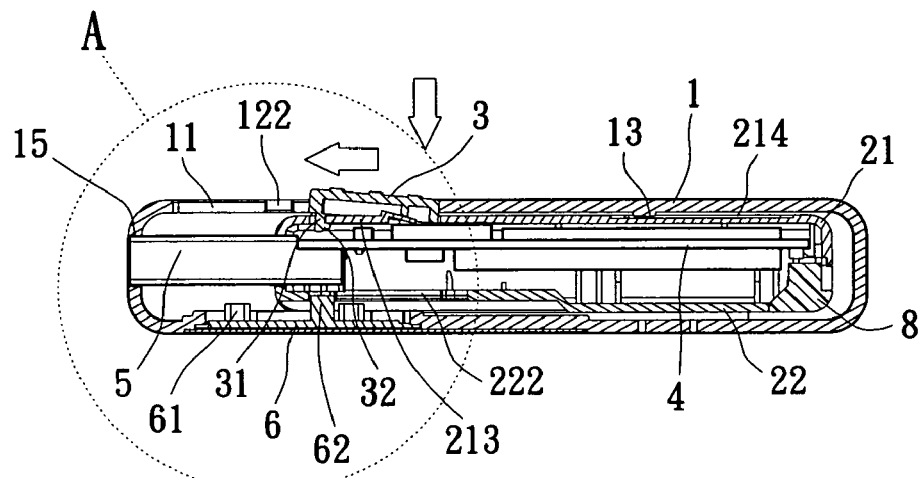
FIG. 7 is a cross-sectional view of FIG. 6.

Please refer to FIGS. 5-7, the keystroke 3 further has an arm extension 31 and a hook unit 32, wherein the arm extension 31 extends through the cover 21 and the hook unit 32 hooks a bottom surface of one end of the flexible arm 213 of the cover 21. The second fixing portion 33 is arranged protruding on one side of the keystroke 3. In the present invention, the second fixing portion 33 is a protruding block used for orientating, and the second fixing portion 33 may alternatively connect with the first sticking gap 121 or the second sticking gap 122 to be wedged in these two different gap locations, so that the keystroke can slide and be latched when the second fixing portion 33 is positioned at the first location of the first sticking gap 121 or the second location of the second sticking gap 122.

Figure 8:
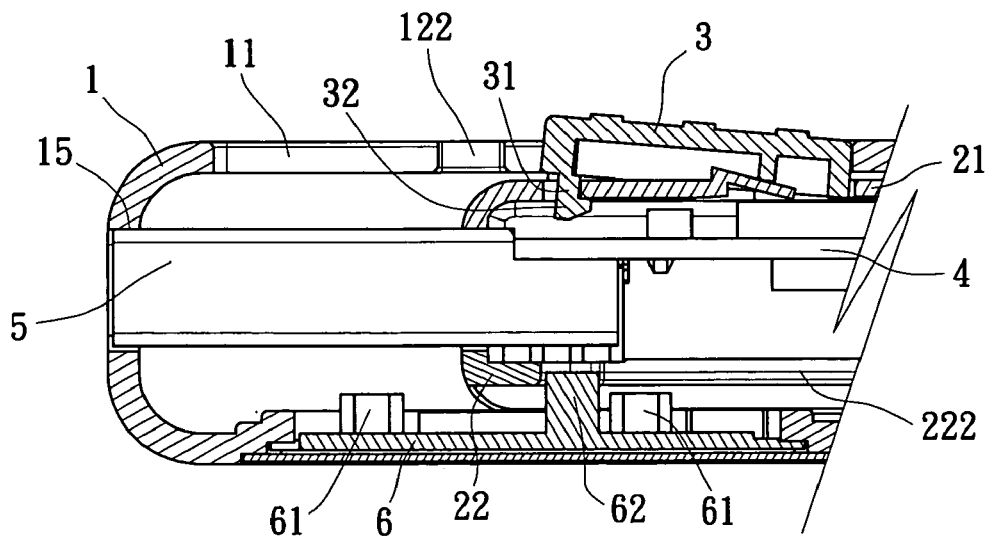
FIG. 8 is a partial enlarged view of A-section of FIG. 7.

Please refer to FIGS. 6-8, when a user connects the portable storage device with the connector port of the computer, the plug 5 should extend outside the housing 1. And the user needs to press the keystroke 3 to make the second fixing portion 33 depart from the first sticking gap 121. Then the flexible arm 213 causes a deformation under the downward pressure of the keystroke 3. At this moment, the user pushes the keystroke 3 to move forward from the first location of the gap 121 to the second location of the gap 122, and drives the casing 2 to slide forward in the interior of the protecting housing 1, so that the electrical plug 5 can extend outside the protecting housing 1.

Figure 9:
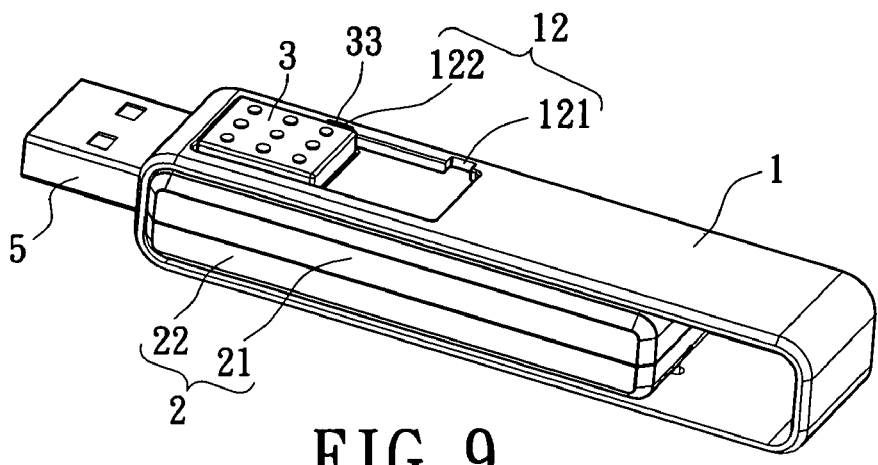
FIG. 9 is a schematic view of another used state of the portable storage device according to the present invention.
Figure 10:
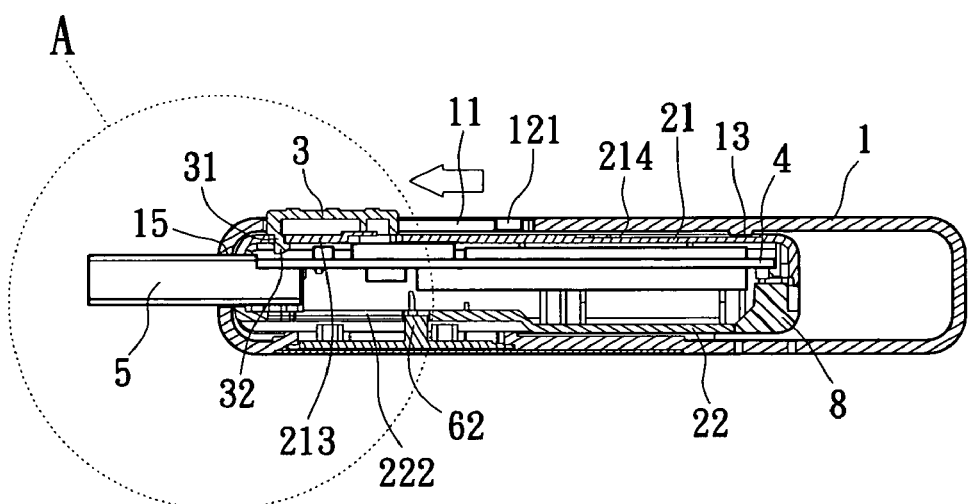
FIG. 10 is a cross-sectional view of FIG. 9.
Figure 11:
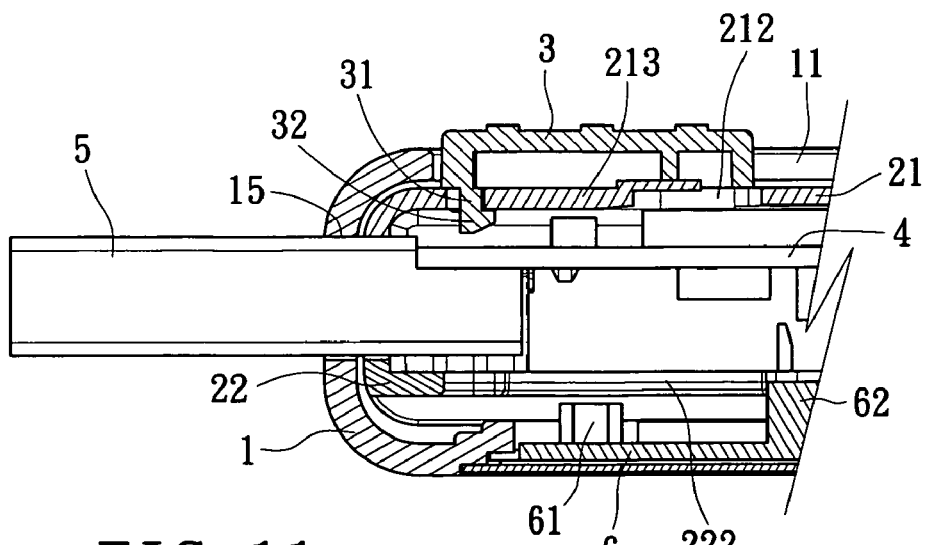
FIG. 11 is a partial enlarged view of A-section of FIG. 10.

Please refers to FIGS. 9-11, when the keystroke 3 arrives the second location of the second sticking gap 122, the deformed flexible arm 213 recovers to the original form, and drives the second fixing portion 33 of the keystroke 3 to extend to the gap 122, so as to fix and position the electrical plug to extend outside the protecting housing 1. From the above description of the present invention, the portable storage device has the following advantages:

(1). Even if the portable storage device is out of order, it is convenient to disassemble the casing 2 from the opening portion of the protecting housing 1, and the repairer can repair the circuit board 4 without damaging the casing 2, so as to save the cost of assembly.

(2). The keystroke 3 contacts and press the casing 2 via the orienting hole 11, and drives the casing 2 to slide within the protecting housing 1, so that the electrical plug 5 can alternatively extend outside the protecting housing 1 to be used for connection or be retracted inside the protecting housing 1 to protected.

(3). The casing 2, the keystroke 3, the circuit board 4, and the electrical plug can be combined as one module design, as that the whole model presents a sense of integral beauty.

Although the present invention has been described with reference to the preferred embodiment thereof, it will be understood that the present invention is not limited to the details thereof. Various substitutions and modifications have been suggested in the foregoing description, and others will occur to those of ordinary skill in the art. Therefore, all such substitutions and modifications are intended to be embraced within the scope of the present invention as defined in the appended claims.

What is claimed is:

1. A portable storage device, which comprises:
 a protecting housing having an opening aperture opened on one end thereof, and an orientating hole which comprising the first fixing portion;
 a casing; and
 a keystroke which comprising the second fixing portion positioning between the orientating hole and the casing;
 wherein the casing sliding with respect to the protecting housing, and wherein the casing latching with the housing when the second fixing portion of the keystroke connecting with the first fixing portion of the orientating hole of the housing.

2. The portable storage device according to claim 1, wherein the first fixing portion further having a plurality of sticking gaps separately, and the second fixing portion of the keystroke connecting with each sticking gap alternatively.

3. The portable storage device according to claim 1, wherein the housing further comprising an opening portion for moving the casing into or out of the protecting housing.

4. The portable storage device according to claim 1, wherein the protecting housing including the first guiding pillar, the casing having the first guiding groove, and the first guiding pillar sliding correspondly in the first guiding groove.

5. The portable storage device according to claim 1, wherein the protecting housing including the second guiding pillar, the bottom surface of the casing has the second guiding groove, and the second guiding pillar sliding in the second guiding groove.

6. The portable storage device according to claim 2, wherein the casing further having a flexible arm pressed by the keystroke.

7. The portable storage device according to claim 6, wherein the keystroke further having an arm extension and a hook unit for hooking the casing.

\* \* \* \* \*